United States Patent [19]

Parfet

[11] 3,800,020

[45] Mar. 26, 1974

[54] METHOD OF MAKING A CIRCUIT BOARD

[75] Inventor: A. James Parfet, Ft. Collins, Colo.

[73] Assignee: Paul C. Cramer Company, Cincinnati, Ohio

[22] Filed: Mar. 23, 1972

[21] Appl. No.: 237,336

[52] U.S. Cl. .................... 264/104, 29/625, 117/31, 117/100 C, 174/52 S, 174/68.5, 174/DIG. 3, 264/111, 264/125

[51] Int. Cl. .......................... B22f 3/12, H05k 3/10

[58] Field of Search ........... 174/68.5, DIG. 3, 52 S; 29/625; 317/101 B; 264/111, 112, 125; 117/100 A, 100 C, 19, 21, 31

[56] References Cited

UNITED STATES PATENTS

| | | | |
|---|---|---|---|
| 3,208,900 | 9/1965 | Inklaar | 264/112 X |
| 3,694,243 | 9/1972 | Campbell | 264/125 X |
| 3,413,393 | 11/1968 | Turk | 264/111 |
| 2,963,748 | 12/1960 | Young | 174/68.5 X |
| 3,696,479 | 10/1972 | Dias | 174/68.5 X |
| 3,075,280 | 1/1963 | Jack et al. | 174/68.5 X |
| 3,040,119 | 6/1962 | Granzow | 174/68.5 |
| 3,013,913 | 12/1961 | Croop et al. | 174/68.5 |
| 2,893,150 | 7/1959 | Tann | 174/68.5 |
| 2,794,940 | 6/1957 | Roup | 174/68.5 X |

FOREIGN PATENTS OR APPLICATIONS

| | | | |
|---|---|---|---|
| 1,112,770 | 8/1961 | Germany | 317/101 B |

*Primary Examiner*—Bernard A. Gilheany
*Assistant Examiner*—A. T. Grimley
*Attorney, Agent, or Firm*—John W. Melville; Albert E. Strasser; Stanley H. Foster

[57] ABSTRACT

A printed circuit board formed by applying a thin layer of powdered metal composed of a mixture of copper-tin-lead to a heat softenable substrate, such as a sheet of thermoplastic resin, followed by the application of a heated die to the powdered surface, the die having the desired circuit pattern formed thereon and acting to sinter the metal particles in the areas contacted by the circuit defining portions of the die and also acting to soften the underlying portions of the substrate to effect a bond between the sintered metal circuit pattern and the substrate, the remainder of the powdered metal layer being unaffected by the sintering operation and readily removable for reclamation and reuse.

6 Claims, 3 Drawing Figures

METHOD OF MAKING A CIRCUIT BOARD

BACKGROUND OF THE INVENTION

The present invention relates to a printed circuit board in which the printed circuit is formed from powdered metal. Various attempts have heretofore been made to utilize powdered metallurgical techniques in the formation of printed circuit boards, printed wiring boards and electrical contacts. For example, U. S. Pat. No. 2,993,815 teaches the application of a copper and glass containing paste to a refractory substrate in the desired pattern, followed by a heat treatment to sinter the metal and cause it to bond to the substrate. U. S. Pat. No. 3,256,109 teaches a technique wherein the metallic compound is initially atomized with the material making up the substrate, with the circuit pattern formed by thermal decomposition induced by a heated die. Another approach is found in U. S. Pat. No. 3,410,714 wherein a circuit forming material, such as powdered copper, is applied to a substrate in the desired pattern, whereupon the structure is heated at a relatively high temperature to cause alloying and bonding of the metal to the substrate.

While, as evidenced by the foregoing, there have been numerous proposals for forming printed circuit boards utilizing powdered metals, the techniques have been complicated and expensive, and do not lend themselves to mass production techniques. In contrast, the present invention contemplates the provision of a simple and inexpensive procedure by means of which printed circuit boards may be easily and rapidly produced with a minimum of wasted materials.

RESUME OF THE INVENTION

In accordance with the present invention, the desired circuit pattern is formed from an alloy of copper, lead and tin in intimate admixture, the lead and tin effectively serving to mechanically plate the copper particles so that the desired bond may be achieved at a relatively low temperature, such as 400°–475°F., which is well below the melting point of the copper, which is a major constituent of the alloy.

The invention permits the use of readily available and relatively inexpensive substrates, such as standard phenolic circuit boards or relatively inexpensive thermoplastic resins, as for example polyvinyl chloride.

A major advantage of the present invention lies in the fact that there is essentially no wasted materials in that all of the powdered metal alloy not utilized to form the circuit pattern itself is unaffected by the sintering operation and may be recovered and reused without any kind of intermediate reclamation steps. To this end, following the sintering operation, the substrates may be inclined or turned over and/or subjected to a vibrating step and/or vacuum to dislodge unused powdered metal into a suitable recovery bin or the like from which it may be directly returned to the feed hopper from which it is initially deposited on the substrate.

The dies by means of which the desired circuit pattern is impressed may be of relatively simple construction, and while their configuration will depend upon the complexity of the circuit being formed, the desired pattern may be readily machined in relief into the surface of a steel plate with the circuit pattern defined by the "lands" of the machined surface. Alternatively, the die may comprise a wire-formed die wherein the lands are formed from wires bent to the desired configuration and brazed or otherwise affixed to a surface of an otherwise plain plate. The dies may be either planar or formed on a cylindrical drum for a rolling type action. Obviously, depending upon the size of the circuit boards being formed, a single die may be utilized to imprint a series of repetitive or non-repetitive circuit patterns on a given substrate which may then be cut into individual units.

Circuit boards produced in accordance with the present invention readily lend themselves to essentially continuous production, the substrates, which may be of any desired size, being continuously fed through a series of operating stations which will sequentially apply the layer of powdered metal to the substrate, contact the powdered surface with the heated die to form the circuit pattern and bond it to the substrate, followed by the removal for reuse of the unused powdered metal.

DESCRIPTION OF THE PREFERRED EMBODIMENT

Figure 1:
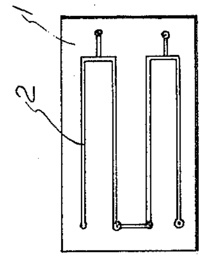
FIG. 1 is a plan view of a circuit board formed in accordance with the present invention having a simple circuit pattern.

Referring first to FIG. 1 of the drawings, the circuit board comprises a substrate 1 having the desired circuit pattern 2 impressed thereon and bonded to the substrate. The material from which the substrate is formed does not constitute a limitation on the invention, although preferably it will be formed from a sheet, either plain or reinforced, of a soft to medium-soft thermoplastic material. Standard phenolic circuit boards may be employed, and excellent results have also been achieved with boards formed from polyethylene and polyvinyl chloride. The boards may be plain or laminated, the essential consideration being that the surface of the board on which the circuit pattern is impressed will soften sufficiently to permit the sintered metal circuit to be firmly bonded to the substrate as an incident of the sintering operation.

Figure 2:
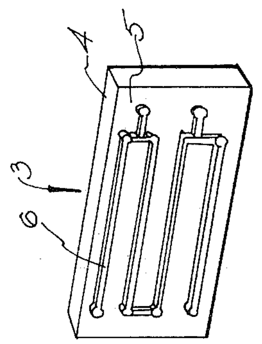
FIG. 2 is a perspective view of a die for forming the circuit pattern impressed upon the circuit board of FIG. 1.

The die for forming the printed circuit pattern is illustrated in FIG. 2, the die 3 comprising a metallic base 4 having a surface 5 from which are formed "lands" 6 configured to define the desired circuit pattern. The "lands" 6 may be formed by machining or, depending upon the configuration of the circuit pattern, they may be formed from wire configured into the desired circuit pattern and brazed or otherwise secured to the surface 5 of the die. The size or other configuration of the dies does not constitute a limitation on the invention and a single die may be utilized to form a multiplicity of repetitive or non-repetitive circuit patterns which will be impressed upon a substrate which is then cut to form as many printed circuit boards as there are repetitive patterns. The dies may be flat or they may be of curved configuration for use in a rotary or rocker dieing operation.

The powdered metal alloy which is employed to form the circuit pattern is composed of from 50 to 85 parts by weight of essentially pure copper, such as Amax high conductivity type "LO" copper intimately admixed with a mixture of lead and tin. The lead and tin will be initially admixed in a ratio of from about 1 part tin to 2 parts lead (by weight) to 2 parts tin to 1 part lead. A preferred composition comprises 70 percent copper and 30 percent tin-lead in the ratio of 1 part tin to 2 parts lead, all parts being by weight. The particle size of the alloying constiuents may vary, although particle sizes of from 60 mesh to 100 mesh are preferred.

An important step in the formulation of the powdered metal alloy is to achieve thorough admixing of the ingredients, and to this end it is preferred to admix the materials in a high speed blender, the objective being to achieve a mechanical plating of the copper particles with the lead-tin particles. It has also been found desirable to incorporate approximately 0.5 percent powdered rosin in the mixture to act as a flux. The blending operation should be performed in a completely clean and oil-free manner since oil and an oxide formation will prevent a good bond when the powdered metal is subjected to the sintering operation.

Figure 3:
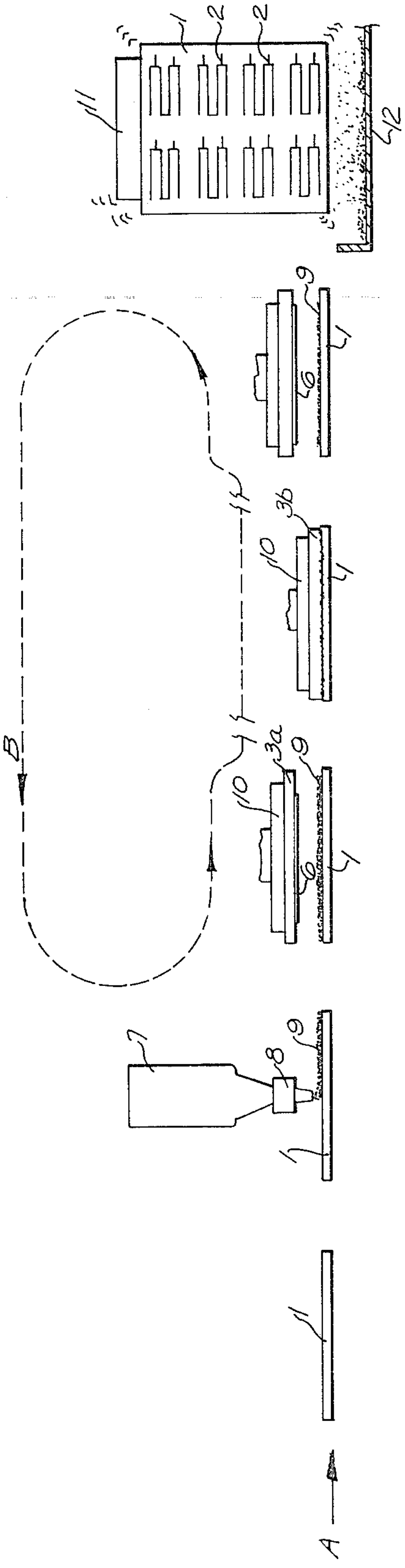
FIG. 3 is a diagrammatic side elevational view illustrating the continuous production of circuit boards in accordance with the invention.

A processing line suitable for forming circuit boards in accordance with the present invention is diagrammatically illustrated in FIG. 3, the substrates 1 being advanced in a path of travel in the direction of the arrow A, the substrates first passing beneath a hopper 7 having suitable metering mechanism 8 which will deposit a uniform layer 9 of the powdered metal alloy on the upper surface of the substrates. The thickness of the layer may be varied as desired, depending upon the desired cross-sectional area of the resultant circuit, but for most purposes the powder thickness will be from 0.005 to 0.030 inch.

Following the application of the powdered layer 9, the substrates will pass beneath a die 3a which is one of a series of dies arranged to move in a path of travel indicated by the dotted line B, the arrangement being such that the dies will be successively lowered into contact with the underlying substrate, as illustrated by the die 3*b*. The dies will thus travel with the substrates for the dwell time required to sinter bond the printed circuit pattern to the substrate. To this end, each of the die carriages includes a heating element 10 which will heat the die to the desired temperature for the sintering opeartion.

The temperature of the dies will be from 400°F. to 475°F., and the dies will be maintained in contact with the powdered layer for from 10 seconds to 70 seconds, with the pressure exerted by the die on the substrate being from 25 pounds to 250 pounds per square inch. Excellent results have been achieved with the die heated to 450°F. and in contact with the substrate for 20 seconds at a pressure of 100 pounds per square inch. Temperatures in excess of 500°F. are to be avoided in that undue softening or melting of the lead and tin will foul the dies.

Since only those areas of the powdered layer 9 contacted by the "lands" 6 of the die will be sinter-bonded to the substrate, the remainder of the powdered alloy may be reclaimed following removal of the die. Thus, as the now imprinted substrates pass beyond the dies, the substrates may be elevated to an essentially vertical position and subjected to the action of a vibrator mechanism 11 which will shake the remainder of the powdered layer from the substrate into a suitable bin 12 from which the powdered alloy may be directly returned to the hopper 7 for reuse. Alternatively, a vacuum system may be employed to remove the remaining powdered alloy either alone or in conjunction with the vibrator mechanism, and vacuum means also may be employed to return the powdered metal to the hopper for reuse.

Thereafter, the substrates are collected for such additional processing steps as may be required, inclusive of cutting a substrate containing a plurality of repetitive patterns into individual units and such further finishing steps as may be required.

As should now be evident, the instant invention provides a simple, efficient and inexpensive procedure for forming printed circuit boards which is essentially waste-free. The resultant circuit boards have a unique sinter-bonded circuit pattern formed from an alloy having excellent dielectric properties, yet the sintering operation is conducted at relatively low temperatures.

Numerous modifications may be made in the invention without departing from its spirit and purpose, and a number of such modifications have already been set forth and others will be readily apparent to the skilled worker in the art upon reading this specification. It will be evident, for example, that the sintering operation may be performed continuously or in a stop-and-go fashion, depending upon the equipment employed and the desired production capacity.

The embodiments of the invention in which an exclusive property or privelege is claimed are defined as follows:

1. A method of producing a printing circuit board or the like which comprises the steps of:

providing a heat softenable substrate having a planar surface, positioning said substrate with said planar surface horizontally disposed, applying a thin uniform layer of powdered metal alloy to the planar surface of said substrate, said powdered metal alloy being composed of from 50 to 85 percent copper and the remainder tin and lead admixed in a ratio of from 1:2 to 2:1 parts lead to tin, said parts and percentages being by weight, including the step of intimately admixing the copper, lead and tin prior to application to said substrate to mechanically plate the copper with the lead and tin, impressing a circuit-pattern in the layer of powdered metal alloy by means of a heated die which sinter-bonds the portions of the powdered metal layer contacted thereby and temporarily softens the underlying areas of the substrate to effect a direct bond between the circuit-pattern so-formed and the substrate, and removing the excess powdered metal alloy layer from the substrates so as to leave only the circuit-pattern impressed thereon, including the step of collecting the excess powdered metal alloy for reuse.

2. The method claimed in claim 1 wherein said die is heated to a temperature of from 400°F. and said circuit pattern is impressed in said layer under a pressure of from 25 to 250 pounds psi, and said die remains in contact with said powdered metal layer for from 10 to 70 seconds.

3. The method claimed in claim 2 wherein said copper, lead and tin each has a particle size of from 60 to 100 mesh.

4. The method claimed in claim 3 wherein said layer of powdered metal alloy has a thickness of from 0.005 to 0.030 inch.

5. The method claimed in claim 4 wherein said powdered metal alloy comprises 70 percent copper and the remainder tin and lead in a ratio of 1 part tin to 2 parts lead, said parts being by weight, said alloy including a rosin size.

6. The method claimed in claim 5 wherein said substrate comprises a thermoplastic sheet.

* * * * *